United States Patent [19]
Puskas

[11] Patent Number: 5,276,376
[45] Date of Patent: Jan. 4, 1994

[54] VARIABLE FREQUENCY ULTRASONIC GENERATOR WITH CONSTANT POWER OUTPUT

[75] Inventor: Peter J. Puskas, Freeport, Ill.

[73] Assignee: Ultrasonic Power Corporation, Freeport, Ill.

[21] Appl. No.: 895,624

[22] Filed: Jun. 9, 1992

[51] Int. Cl.$^5$ .......................................... H01L 41/08
[52] U.S. Cl. .................................... 310/317; 310/316; 366/108; 366/116; 366/127; 95/30; 96/175
[58] Field of Search ............... 310/316, 317, 319, 323; 318/116; 55/15; 366/108, 114, 116, 117, 127

[56] References Cited

U.S. PATENT DOCUMENTS

| | | | |
|---|---|---|---|
| 3,573,781 | 4/1971 | Shoh | 310/317 X |
| 3,638,087 | 1/1972 | Ratcliff | 318/118 |
| 3,746,897 | 7/1973 | Karatjas | 310/316 |
| 4,275,363 | 6/1981 | Mishiro et al. | 310/316 X |
| 4,302,728 | 11/1981 | Nakamura | 318/116 X |
| 4,398,925 | 8/1983 | Trinh et al. | 55/15 |
| 4,554,477 | 11/1985 | Ratcliff | 310/316 |
| 4,559,826 | 12/1985 | Nelson | 310/317 X |
| 4,562,413 | 12/1985 | Mishiro et al. | 331/116 |
| 4,687,962 | 8/1987 | Elbert | 310/316 |
| 4,703,213 | 10/1987 | Gasler | 310/316 |
| 4,736,130 | 4/1988 | Puskas | 310/316 |
| 4,864,547 | 9/1989 | Krsna | 367/137 |
| 4,868,521 | 9/1989 | Konrad | 310/316 X |
| 4,888,565 | 12/1989 | Littleford et al. | 310/316 X |

Primary Examiner—Mark O. Budd
Attorney, Agent, or Firm—Leydig, Voit & Mayer

[57] ABSTRACT

A generator for driving an ultrasonic transducer for use in ultrasonic cleaning. The generator is based on a voltage controlled oscillator which drives an output circuit which includes the ultrasonic transducer. The output circuit has a resonant frequency, and a resonance follower produces a control voltage which tunes the voltage controlled oscillator to the resonant frequency. Operating in conjunction with the automatic tuning elements is a constant power control which allows the user to set a desired power level, and monitors the actual output power by means of an output wattmeter circuit, to cause the actual output power to match the level selected by the user. The constant output power circuit is effective even during resonance tracking of the system, or during frequency modulation of the ultrasonic output energy.

19 Claims, 5 Drawing Sheets

VARIABLE FREQUENCY ULTRASONIC GENERATOR WITH CONSTANT POWER OUTPUT

FIELD OF THE INVENTION

This invention relates to ultrasonic cleaning, and more particularly to an improved generator for driving ultrasonic transducers used in cleaning.

BACKGROUND OF THE INVENTION

In ultrasonic cleaning, a transducer, usually piezoelectric but sometimes magnetostrictive, is secured to a cleaning tank to controllably impart ultrasonic vibrations to the tank. The tank is filled with a cleaning liquid and parts are immersed into the liquid to be cleaned by ultrasonic agitation and cavitation. Interaction between the ultrasonically agitated liquid and the contaminants carried by parts immersed in the liquid causes the contaminants to be dislodged.

Various circuits have been configured for driving the ultrasonic transducer and have provided a variety of features. Parameters which are available for adjustment or control are the ultrasonic frequency, the power level, amplitude or frequency modulation, and duty cycle control of power bursts, among others.

In ultrasonic cleaning, it is known that the output circuit, which usually includes a driver, the ultrasonic transducer, and the mechanical system which it drives have a resonant frequency. The mechanical system, of course, includes the liquid in the tank and the parts immersed in the liquid. Quite clearly, the mass and shape of the parts, the temperature of the liquid, and other factors, all influence the resonant frequency of the output circuit. In some cases, the driver circuit is tuned to the approximate resonant frequency of the load by selection of inductance and capacitance values, and in other cases, the driver can drive the load either on or off resonance.

The art has developed to allow users various controls over the frequency of the ultrasonic generator in an effort to match the resonant frequency of the generator to that of the mechanical system. Indeed, it has been proposed to allow the system to automatically tune to the resonant frequency of the system, but such automatic resonance tuning has not been entirely satisfactory, particularly when combined with other forms of ultrasonic generator control. In Ratcliff U.S. Pat. No. 4,554,477, for example, the output circuit which includes the driver and the load is tuned for automatic resonance tracking, but the power output is intentionally varied or modulated to produce peak power which is substantially higher than the average power output.

It has been proposed to allow the user to adjust a sweep frequency, i.e., a cyclical change in output frequency with respect to time. The aforementioned Ratcliff patent includes a sweep feature to allow sequential resonating of a number of ultrasonic transducers driven in series. Other controls which have been proposed include duty cycle control of the output frequency (bursts of ultrasonic pulses with duty cycle controlled on and off intervals), amplitude modulation of the ultrasonic pulses, and the like. Various forms of power controls have also been proposed. Krsna U.S. Pat. No. 4,864,547 exemplifies a typical approach of using a shunt resistor in one of the main power supply circuits as a general indicator of power delivered to the load. But the measure is indirect and inaccurate because it relates primarily to input power and does not take account of output efficiency.

A further example of an ultrasonic generator including multiple controlled parameters can be found in William Puskas, U.S. Pat. No. 4,736,130. That patent discusses adjustments for the center frequency of the ultrasonic drive, the on and off time of power bursts of the ultrasonic pulses, degas on and off time, as well as amplitude modulation of the ultrasonic power bursts.

It is understood that there is a relationship between the output frequency of the generator, its relationship to the resonant frequency of the system, and the power delivered to the output circuit. Various systems have attempted to monitor power by, in effect, measuring input power to the generator. Thus, ultrasonic controls have been available which claim to be constant power, but which simply include a shunt resistor in the input power circuit which is, at best, a crude indicator of output power, since efficiency and the like are dependent upon the degree to which the system is on or off resonance. It is known, for example, that as the frequency varies from a resonance point to an off resonance point the efficiency of the system decreases, and the power delivered to the load is also reduced.

Thus, it is not a simple matter to propose a multiply controlled ultrasonic generator which is capable of producing constant power, because variation of the frequency parameters, for example, has a direct impact upon the power delivered to the output. Nor is it possible to simply measure input current to the system, and use that as a basis for suggesting constant output power, particularly in systems which allow the variation of center frequency of the ultrasonic drive or its sweep.

Thus, while it has been thought desirable to provide the user with features such as automatic resonance seeking, constant and adjustable power output, and the like, it has not been possible heretofore to provide those features in the same ultrasonic generator. Tradeoffs were necessary due at least in part to the state of the art.

SUMMARY OF THE INVENTION

In view of the foregoing, it is a general aim of the present invention to provide an ultrasonic generator which provides a true constant power output over a useful operating power range, and at the same time provides for automatic resonance tracking.

Thus, it is an object of the present invention to provide an ultrasonic generator which includes a power setting control which assures that the power delivered to the load is at the preset level. It is a corollary object to configure such a system along with automatic resonance tracking, so that even when the system changes the frequency of the ultrasonic generator to that demanded by the automatic resonance tracking system, the power output remains at the level set by the user.

A general objective is to provide a system which degasses the cleaning liquid in a quick and efficient manner. In accomplishing that objective, it is a further object to provide user selectable frequency modulation of the ultrasonic frequency. In more detail, it is an object to intentionally sweep the ultrasonic frequency away from the automatically tuned resonance point, at a rate and for a deviation determined by the user, while at the same time assuring that the output power is at the preset and desired level.

Thus, it is a resulting object to provide an ultrasonic generator which provides ease of use in that the user need only set the power level which he understands is needed for a particular cleaning application, and the system automatically tunes to the frequency of the load which is in the tank at that time. Furthermore, in a situation where the user determines that frequency modulation would be of value, such as for degassing at the start of a cleaning cycle, the user is capable of simply dialing in the frequency modulation parameters, without concern about altering the power level to be delivered to the load.

In accomplishing the various aims of the invention, it is a subsidiary object to provide a wattmeter circuit for use with an ultrasonic generator which measures the voltage, current and power factor in the output circuit to monitor the output power for comparison against a desired settable output power level. In that respect, it is a further object to provide such a system in connection with a high efficiency generator which has no input isolation transformer, thereby requiring the provision of an isolated output circuit wattmeter.

It is a feature of the invention that the user need set only the output power level, and frequency modulation parameters if desired, and the system will automatically tune to the resonant frequency of the output circuit, thereby assuring high efficiency and reliable operation of the generator. In that respect, it is a further feature that when frequency modulation is selected, the characteristics of the automatic resonance tracking circuit are configured to allow the intentional modulation of the resonance frequency to a predetermined amount off-resonance. Thus, the systems cooperate to prevent the automatic resonance tracking elements from canceling or nullifying the user selected frequency modulation.

In that respect, it is a further feature that the system modulates the power to the output by means of phase modulating the DC power supply for the output stage. Thus, the output power is modulated quite independently of the frequency, and even though the frequency of operation has an impact on the power delivered to the output, the mechanism for adjusting power output is independent of the ultrasonic frequency. Thus, the user settable power level can be accomplished even though the system is automatically tuning the resonant frequency, without creating an unstable or unreliable control system.

Other objects and advantages will become apparent from the following detailed description when taken in conjunction with the drawings, in which:

DETAILED DESCRIPTION OF THE PREFERRED EMBODIMENTS

While the invention will be described in connection with a preferred embodiment, there is no intent to limit it to that embodiment. On the contrary, the intent is to cover all alternatives, modifications and equivalents included within the spirit and scope of the invention as defined by the appended claims.

Figure 1:
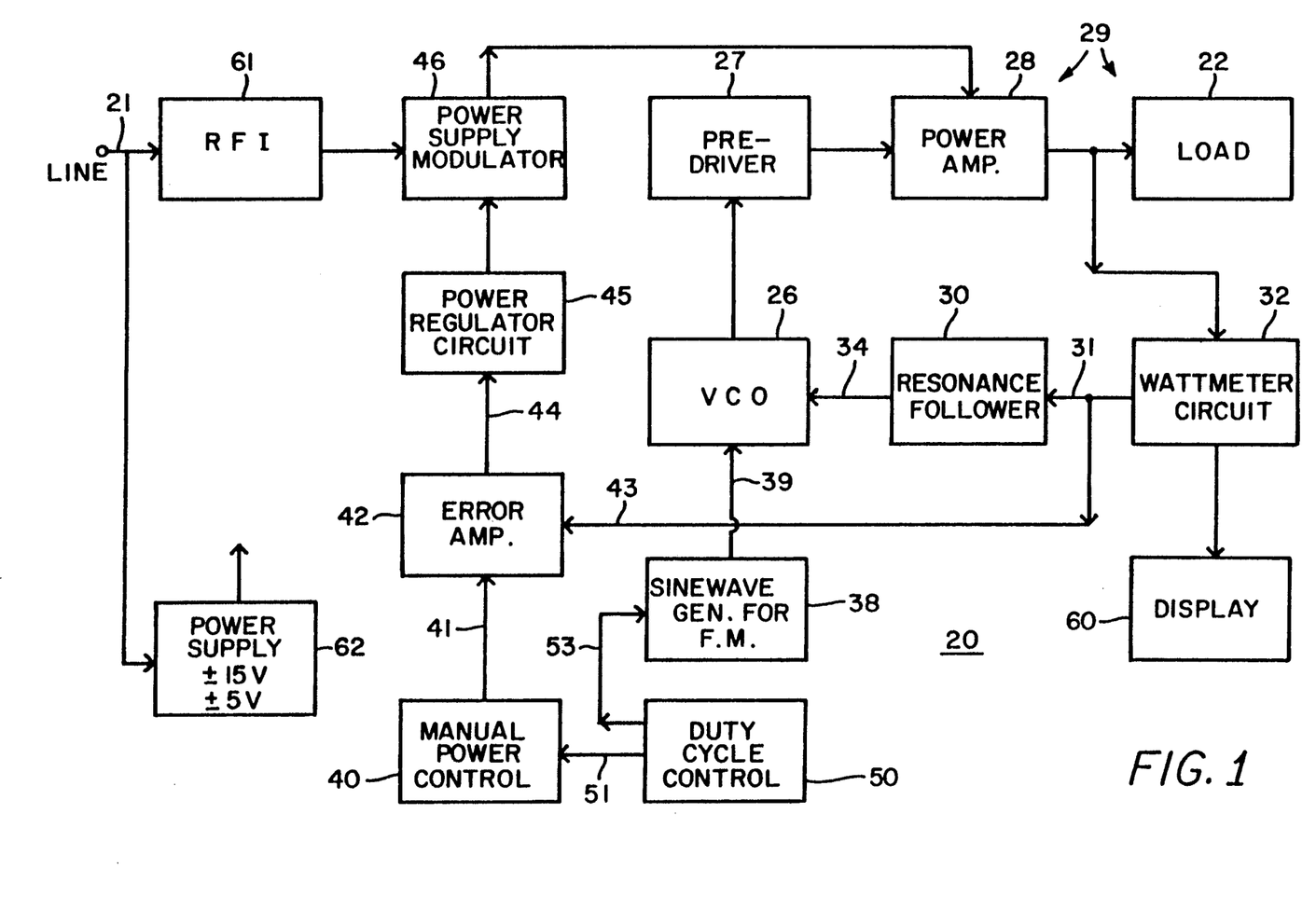
FIG. 1 is a block diagram of an ultrasonic generator exemplifying the present invention.

Turning now to the drawings, FIG. 1 shows an ultrasonic generator 20 being powered from an AC line 21 and being adapted to drive a load 22 which includes the ultrasonic transducer and the mechanical system coupled thereto. As will become more apparent, the load is tuned in the sense that it has a resonant frequency. The output frequency of the generator 20 is based on that established by a voltage controlled oscillator 26 which delivers an oscillating output signal to a predriver 27 and thence to an output stage or power amplifier 28. The power amplifier 28 and load 22 are sometimes collectively referred to herein as output circuit 29. In the output circuit 29, the power amplifier 28 is coupled to the load 22 for driving the load at the frequency established by the voltage controlled oscillator 26.

In practicing one aspect of the invention, the system includes a resonance follower 30 having an input 31 coupled to the output circuit 29. In the illustrated embodiment, the input 31 of the resonance follower is coupled to a wattmeter circuit 32 which provides signals related to the voltage or current in the load. The change in the signal on input 31 with respect to a change in the driving frequency is a measure of whether the load 22 is at or is approaching resonance. Thus, if the signal on line 31 corresponds to load voltage, as that signal peaks while adjusting frequency, it will be appreciated that the system is approaching resonance. When the voltage across the load is at a maximum, the system is being driven at about resonance. In an alternative system, if the signal on the input 32c relates to load current, as the signal reaches a null (with a corresponding increase or decrease in frequency), it will be appreciated that the system is also approaching resonance, and the resonance point is at the null in the signal. The resonance follower 30 thus responds to the magnitude or change in magnitude of the signal on input 31 and produces a signal on the output 34 which is coupled to the control input of the voltage controlled oscillator 26 for tuning the voltage controlled oscillator to the frequency at which the output signal resonates the load. Preferably, the resonance follower includes means for sweeping the output frequency of the voltage controlled oscillator from one end of its range toward the other; encountering the resonant frequency then terminates the sweep.

The circuit thus far described is capable of automatically tuning the voltage controlled oscillator to the resonant frequency of the load. In some cases, however, it is desirable to operate at frequencies which sweep about the resonant frequency. In accordance with the invention, frequency modulation of the ultrasonic output provides an enhanced degassing capability. In the past, degassing has been accomplished by means such as pulsing the ultrasonic output on and off for controllable periods. This has been found to be less satisfactory than the degassing system according to the invention. In accordance with this aspect of the invention, frequency modulation of the resonantly tuned output is provided which controllably sweeps the ultrasonic frequency about the resonant frequency. Tests have indicated that a modulating frequency in a range between about 100 Hz. and 300 Hz. is most effective and can accomplish degassing efficiently to remove excess bubbles from the liquid before commencing of the cleaning cycle.

Thus, having tuned the voltage controlled oscillator 26 to a frequency which corresponds to the resonant frequency of the load, means are provided to modulate that tuned frequency in a controlled fashion. To that end, a signal generator 38 is provided having an output 39 coupled to a control input of the voltage controlled oscillator 26. Preferably, the output 39 of generator 38 is a sine wave used for frequency modulating the ultrasonic frequency about the automatically tuned resonance frequency. For example, if the voltage controlled oscillator tunes the system to, for example, 40 kHz., the operator has the ability to frequency modulate the 40 kHz. ultrasonic frequency at a rate and to a depth which are both controllable. Thus, the operator may select a modulating frequency of 300 Hz., and the voltage controlled oscillator will be caused to produce an output which is substantially a 40 kHz. carrier modulated at 300 Hz., thus sweeping between set limits (established by a bandwidth control) at the 300 Hz. rate selected by the operator.

The time constants of the elements are coordinated such that the modulation frequency can be applied to the voltage controlled oscillator by the modulator 38, while the resonance follower 30, operating with a longer time constant, is prevented from overriding the modulation. Thus, even though the modulating generator 38 is driving the voltage controlled oscillator to frequencies off the resonant frequency of the load, and the resonance follower 30 can sense that the system is moving off-resonance, the time constant of adjustment of the resonance follower is such that the modulation will be accomplished without having the resonance follower 30 correct for the intentionally introduced modulation.

In practicing another important aspect of the invention, the system is adapted to allow user setting of a desired power level, to monitor the actual output power delivered to the transducer, and to maintain that output power at the preset level. Thus, a manual power control 40 is provided which produces a desired power level input signal 41 for an error amplifier 42. The second input 43, to be compared against the desired power level signal 41, is derived from the wattmeter circuit 32. The wattmeter circuit 32 in turn is connected in the output circuit 29 to measure voltage, current and phase angle in the load 22, thus to provide an indication of actual power delivered to the load. A signal having a magnitude related to the actual delivered power is output by the wattmeter circuit 32 onto the line 43 and coupled to the error amplifier 42. The error amplifier 42 in turn produces an output signal on line 44 which is coupled to a power regulator circuit 45. The output signal on line 44 has a magnitude which adjusts the power regulator circuit 45 to modulate the output of a power supply 46 thereby to modulate the level of the DC supply provided to the power amplifier 28. Thus, if the actual power in the load is higher than that demanded by the user control 40, the power regulating circuit 45 causes the power supply modulator 46 to reduce the level of the power supply to the amplifier 28, and thereby reduce the output power delivered to the load. Similarly, if the power measured by the wattmeter 32 is less than that demanded by the power control 40, that condition is sensed by the error amplifier 42 which increases the output of the power regulator circuit 45, thereby causing the power supply modulator 46 to raise the voltage of the supply for the output amplifier 28, and thereby increase the power in the load to that demanded by the power setting.

It is significant to recall that the power delivered to the load is also highly dependent on the frequency of the ultrasonic generator. Thus, as the frequency of the generator varies, assuming a constant input DC voltage to the output stage, the actual power delivered to the load will vary both as a function of frequency and the fact that the change in frequency is driving the system either closer to or farther from resonance. It is known that the maximum power will be delivered to the load when it is driven at about its resonant frequency. Thus, the wattmeter circuit 32 which is connected directly in the output circuit will sense this actual output variation in power as the resonance follower 30 tunes the voltage controlled oscillator 26 to achieve resonance. While the resonance follower is performing its function to achieve resonance, the error amplifier 42 is also performing its function to attempt to maintain the output power level at about the level selected by the user. The time constants of the respective circuits are adjusted to primarily allow resonance to be found quickly, while a longer time constant is associated with the power output circuit so that, once resonance is found, the proper power output level is maintained.

However, it will also be appreciated that the output circuit can experience a change in resonant frequency during operation. For example, when parts to be cleaned are added to or removed from the cleaning tank, the mass of the mechanical system changes, and that will impact the resonant frequency. Similarly, a change in the temperature of the bath in the ultrasonic cleaning tank will have an impact on the ultrasonic frequency. During these normal operating conditions, the resonance follower 30 will continue to tune the voltage controlled oscillator 26 to maintain the output frequency at the resonant frequency of the load. At the same time, the wattmeter 32 will continue to monitor the actual power in the output circuit, and the error amplifier 42 will continue to modulate the input voltage to maintain the output power at the preselected level. As an example, assume the system is operating in a quiescent condition at about the resonance frequency and delivering the magnitude of power demanded by the user. Conditions then change such as by adding liquid or parts to the ultrasonic cleaning tank. Both the resonance follower 30 and the wattmeter 32 detect the change in the mechanical system which is reflected in the output circuit. The resonance follower attempts to tune the voltage controlled oscillator 26 to find a new resonance frequency if it exists. At the same time, the wattmeter 32 signals the error amplifier 42 to adjust the power level to cause the power delivered to the load to match that selected by the input 40. As the voltage controlled oscillator 26 is tuned, that also has an impact on the power measured by the wattmeter 32, and that can cause a further change in the output of error amplifier 42. In the end, however, the resonance follower 30 will have monitored the voltage (or current) in the load to establish the operating frequency of the voltage controlled oscillator 26 at the resonant frequency of the load, while the error amplifier 42 will have adjusted the level of DC power delivered to the amplifier 28 so that the actual ultrasonic power in the load circuit, in addition to being at the resonant frequency, is at the level demanded by the manual power control 40.

A subsidiary feature of the invention is a duty cycle control 50 which is adapted to provide a user adjustable control of the duty cycle of certain characteristics of the ultrasonic output. In one mode, the duty cycle control operates through a first output 51 to control the power output of the system. Thus, the output 51 is connected to the manual power control 40 to alternate the power demand signal between a first level selected by the power control 40, and a second level of substantially zero. Thus, when operating in the duty cycle control mode over power, the system delivers power in the output circuit as actually measured by the wattmeter 32 which alternates between the level selected by the manual power control 40 and substantially zero. The average power output will thus be a lesser value. It will also be possible, of course, to process the actual power, demanded power, and duty cycle signals to cause the output power to be at an average level which matches that selected by the manual power control 40. With that alternative, the output circuit will alternate between an on condition in which power is at a level higher than the average level, an off condition in which no power is delivered, with the duty cycle serving to average the power over each cycle to the average level selected by the power control 40. It is, however, currently preferred to operate the system such that during the on periods of the duty cycle, the power is at a level selected by the power control 40, and during the off periods, the power is at zero.

The duty cycle control 50 also has an output 53 which is connected to the modulation generator 38. In a second duty cycle control mode, the duty cycle control establishes two conditions for the sine wave generator 38, a first in which the modulation signal is provided to the voltage controlled oscillator 26 for modulation thereof, and a second in which modulation is off and the voltage controlled oscillator 26 has a constant frequency at about the resonant frequency of the load.

A display 60 is coupled to the wattmeter circuit 32 for providing an indication of the actual power delivered to the load. In some cases, it is convenient to make the display multi-functional for selective display of delivered power, modulation level, resonant frequency, and the like.

It is worthwhile to note that the AC line input 21, in the preferred embodiment of the invention, is coupled to the remainder of the system without the use of an isolation transformer. Elimination of an isolation transformer increases the efficiency of the system which can be important in certain ultrasonic generators. In the illustrated embodiment, the only element interposed between the AC line input 21 and the power supply modulator 46 is an RFI filter 61 which prevents transients generated in the ultrasonic generator from being coupled back to the AC line. A DC power supply 62 is also driven directly from the line, and as is more conventional, will include a stepdown transformer for reducing the level of the AC voltage to a level compatible with the necessary DC supplies, in a practical embodiment, positive and negative 15 volts and positive 5 volt supplies.

Turning now to FIGS. 2a-2d, there is shown a circuit diagram of a preferred embodiment of the invention having the structure and functionality of the system described in connection with FIG. 1. The circuit diagram is simplified to a certain extent by eliminating certain connections and components which will be utilized in the actual circuit, but whose presence in the patent drawings would only serve to distract from an understanding of the invention. Thus, for example, certain biasing resistors which would be used to implement a particular biasing network have been eliminated, with the network reduced to a single biasing component so as to focus on the functionality of the bias rather than the structure of how a particular circuit element would be applied. It will be appreciated that one skilled in the art will thus be appraised of the important structural and functional features of the invention, and in implementing the invention with particular circuit components, will be able to include the additional peripheral elements necessary to make that structure function.

Figure 2A:
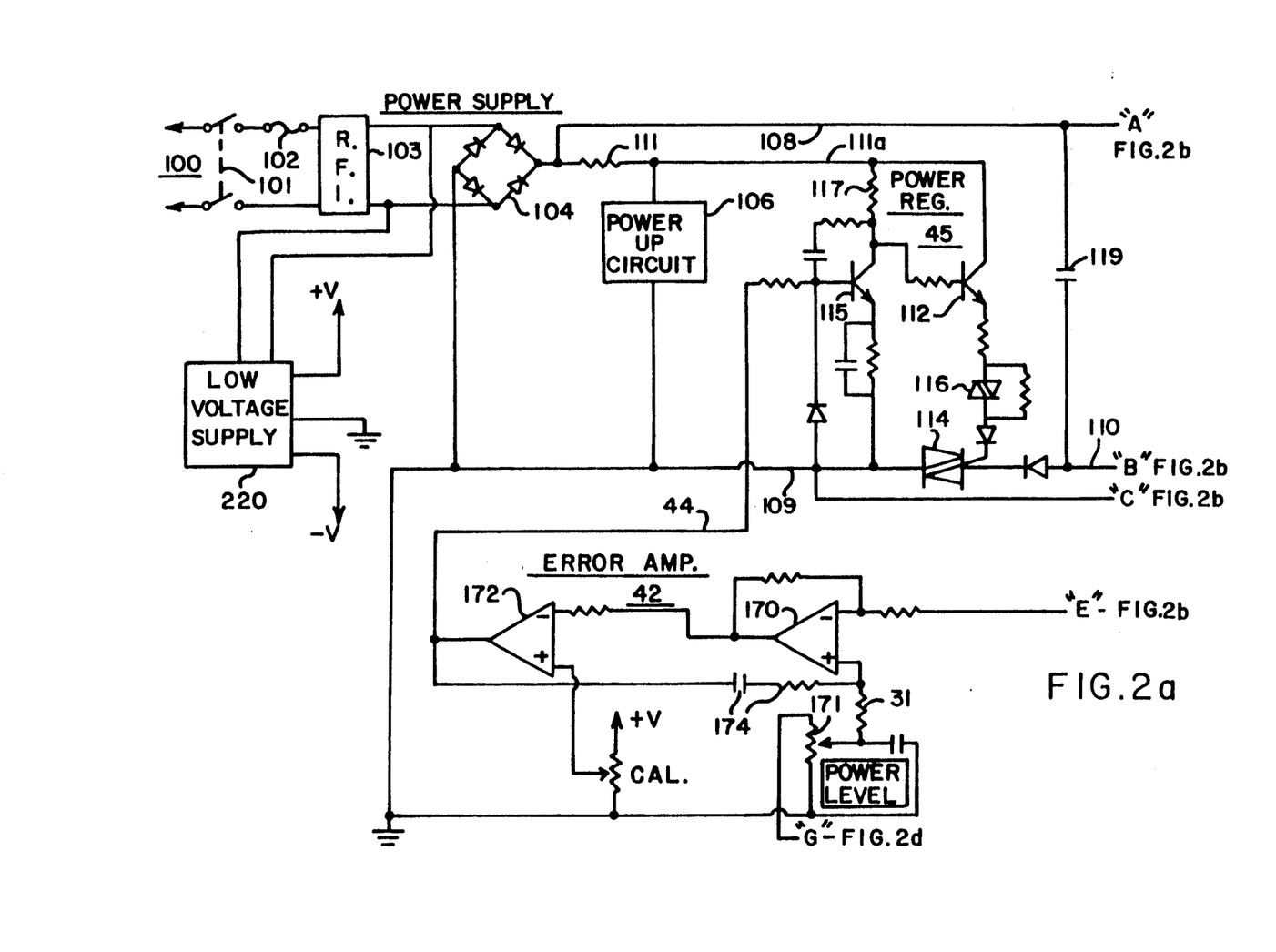
FIG. 2a-2d are more detailed circuit diagrams of the generator of FIG. 1.

Turning to FIG. 2a, the system utilizes a single phase AC supply 100, preferably 120 volts, 60 Hz. coupled through an on-off switch 101, a conventional fuse 102, and an RFI filter 103 directly to a full wave bridge rectifier 104. It will be appreciated that no isolation transformer is used in the input supply, and thus the inefficiencies normally associated with passing reasonably large amounts of power through an input transformer are avoided.

A block 106 signifies a power-up circuit or turn-on circuit which senses the rising supply voltage at system turn-on, and holds certain elements, such as the main power triac, in a turned-off or disabled condition until the power supply stabilizes and the system is ready for operation. The output of the full-wave bridge 104 is imposed across a main power bus 108, 109, and it is seen that power regulator 45 is coupled to the line 109 of that bus for controlling the magnitude of the voltage on an output bus 108, 110 which supplies to the power amplifier 28.

In the power regulator circuit, a resistor 111 is interposed between the full-wave bridge 104 and an internal bus 111a to provide an undulating full-wave rectified supply on the bus 111a. A transistor 115 is operated in a linear fashion and has a degree of conduction dependent upon the magnitude of the error signal on line 44 produced by the error amplifier 42. A transistor 112 in turn is driven from the collector of transistor 115, the transistor 112 being connected as an emitter follower, and having its collector connected to the undulating supply 111a. Thus, when the error signal on the input 44 is at a comparatively high positive level, the transistor 115 will be conducting relatively hard, causing the transistor 115 to appear as a relatively low impedance as compared to a collector resistor 117. As a result, the collector of transistor 115 will reproduce the undulating supply but at a relatively low voltage level, since most of the supply will be dropped across the collector resistor 117. The emitter follower 112 will thus have, at the emitter thereof, a replication of the undulating supply, but at a relatively low level. That low level undulation will cause a break-over of a diac 116 relatively late in the AC cycle, which will result in the phase modulation of triac 114 to produce a relatively low voltage on the output bus 108, 110. However, as the output of the error amplifier 42 decreases, or becomes less positive, transistor 115 will conduct less hard, appearing as a larger impedance, and approaching the magnitude of collector resistor 117. Thus, the voltage swing seen at the collector of transistor 115 will be higher, such that the collector 115 will carry the undulating DC at a larger magnitude. Those larger swings will appear at the emitter of emitter follower transistor 112. Since the break-over voltage of the diac 116 remains the same, the end result will be to cause the break-over of the diac 116 earlier in the AC cycle, causing the triac 114 to conduct for a greater proportion of each cycle, thereby producing a higher DC voltage on the output bus 108, 110. A relatively large filter capacitor 119 serves to stabilize the DC on the output bus 108, 110.

It will now be appreciated, however, that the power regulator circuit 45 responds to the DC level output by the error amplifier 42 to phase modulate the triac 114 and thereby control the DC voltage level on the output bus 108, 110. The output bus 108, 110 in turn is coupled to the power amplifier 28. The power amplifier 28 comprises a plurality of parallel connected transistors 120, only two of which are shown in the drawing. The transistors 120 are connected as common emitter switches, with the primary of an output transformer 121 being connected in the collector circuits thereof. Ignoring base drive to the transistors 120 for the moment, it will be appreciated that the current flow through the transistors will be a function of the magnitude of the DC supply on bus 108, 110. Thus, whenever the transistors 120 are switched on, the magnitude of current flow through the primary of transformer 121 will be determined by the magnitude of the DC voltage on the bus 108, 110. Accordingly, the power coupled through the transformer 121 to the load 22, which includes ultrasonic transducer 125 and the actual load itself 126, is controlled by modulating the DC supply for the power amplifier 28. For high voltage levels on the bus 108, 110, the current for each conduction interval of the transistors 120 will be relatively higher, causing a greater amount of power to be coupled to the load 22. Contrary-wise, when the triac 114 is phase-modulated at a relatively low phase angle, the magnitude of the voltage on the bus 108, 110 is at a comparatively lower level, such that when the transistors 120 are conducting, there is a lower level of current in the transformer 121 and thus a lower level of power delivered to the load 22.

It is seen that the predriver circuit 27 (FIGS. 2b, 2c) is the element which supplies base drive to the transistors 120 of the power amplifier 28. The predriver includes a transistor 130 connected in emitter follower fashion to be driven from a signal derived from voltage controlled oscillator 26. Thus, the transistor 130 will be switched on and off at the ultrasonic frequency. The emitter of transistor 130 is coupled to the primary of a transformer 131, thereby supplies drive, by way of the transformer secondary to the bases of all of the parallel connected power transistors 120. Thus, it will be appreciated that the ultrasonic output signal produced by the voltage controlled oscillator 26 drives the transistor 130 at the ultrasonic frequency and thus supplies base drive to the power amplifier 28 at the ultrasonic frequency.

Figure 2B:
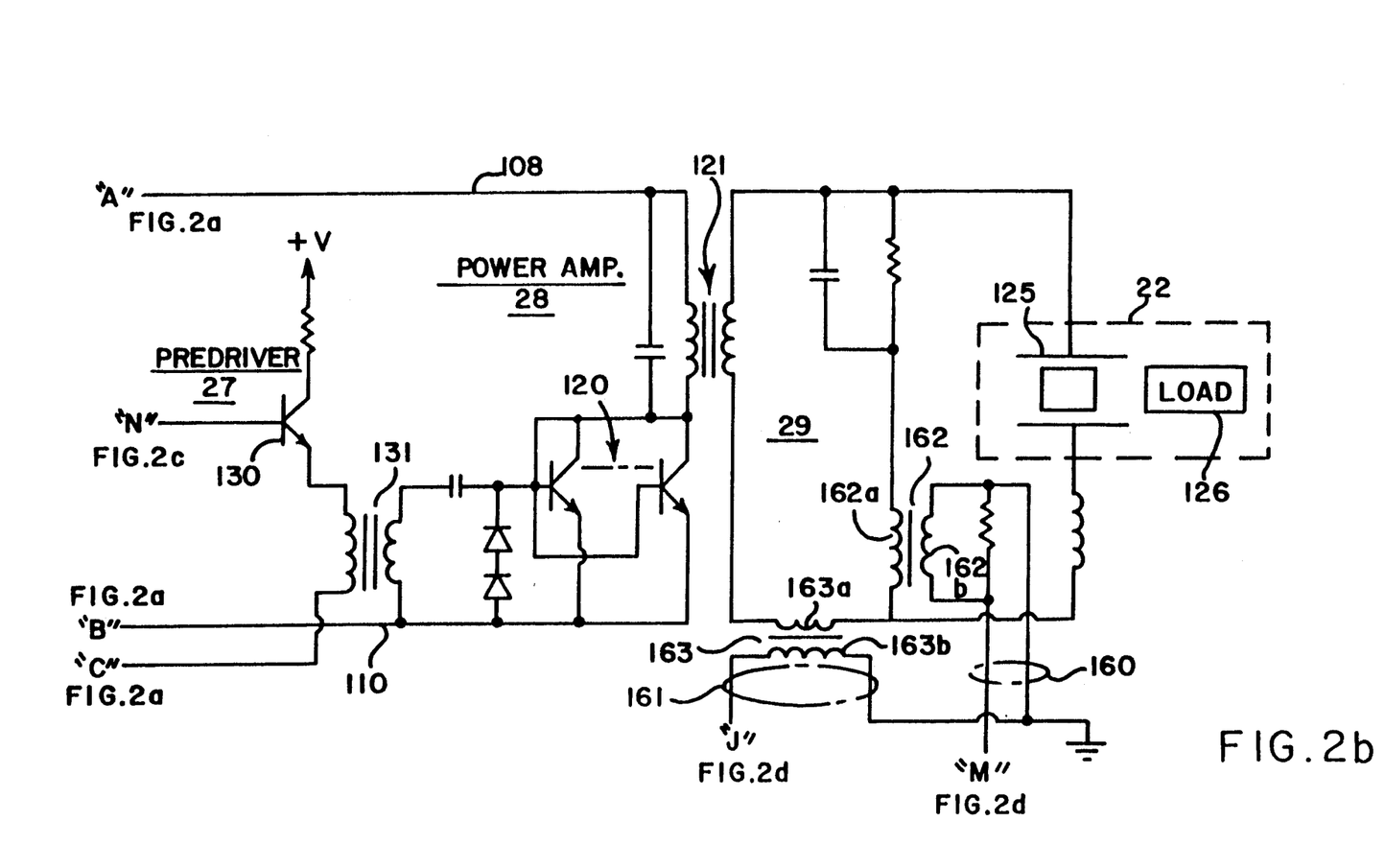
Figure 2C:
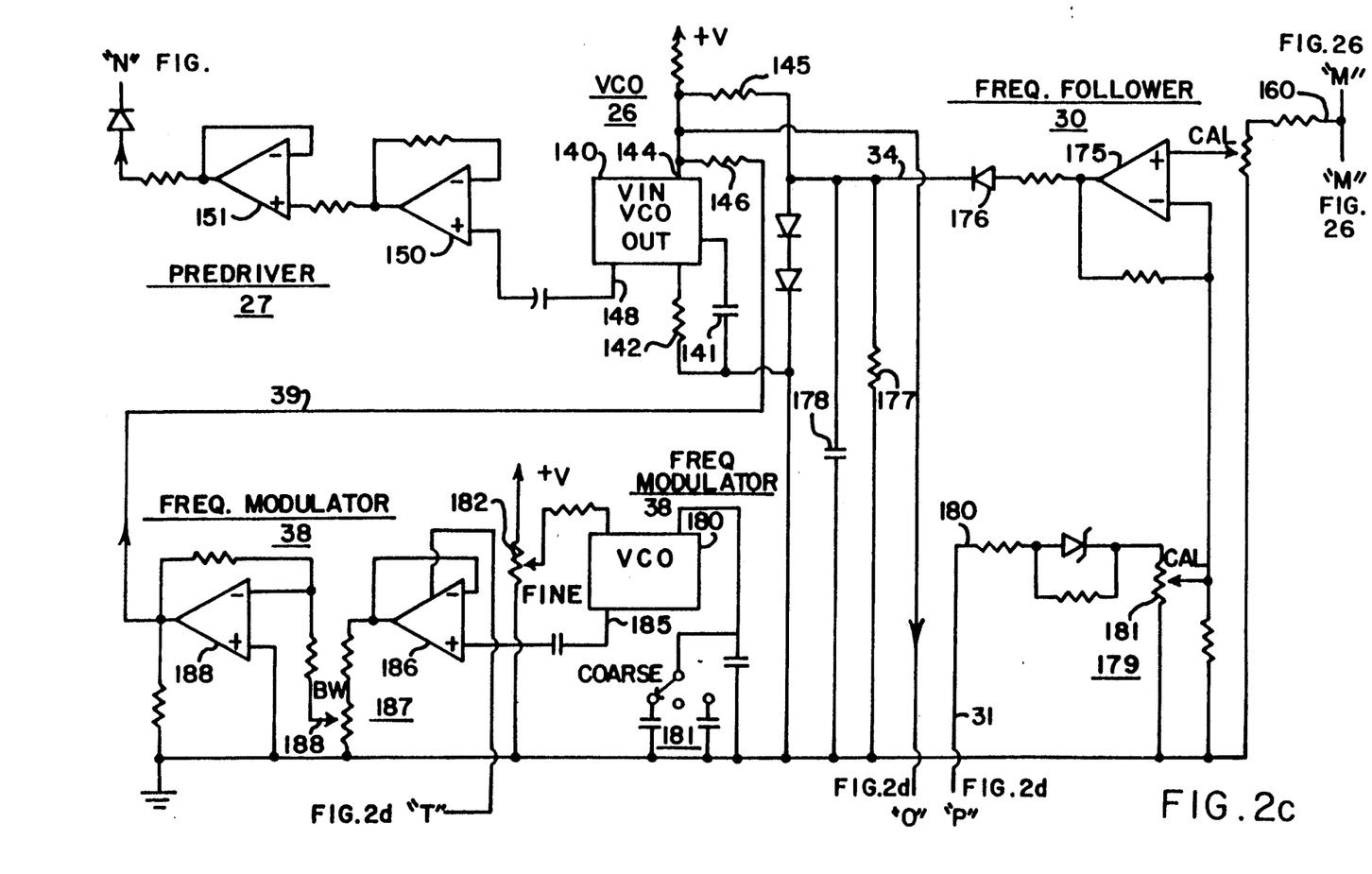
Figure 2D:
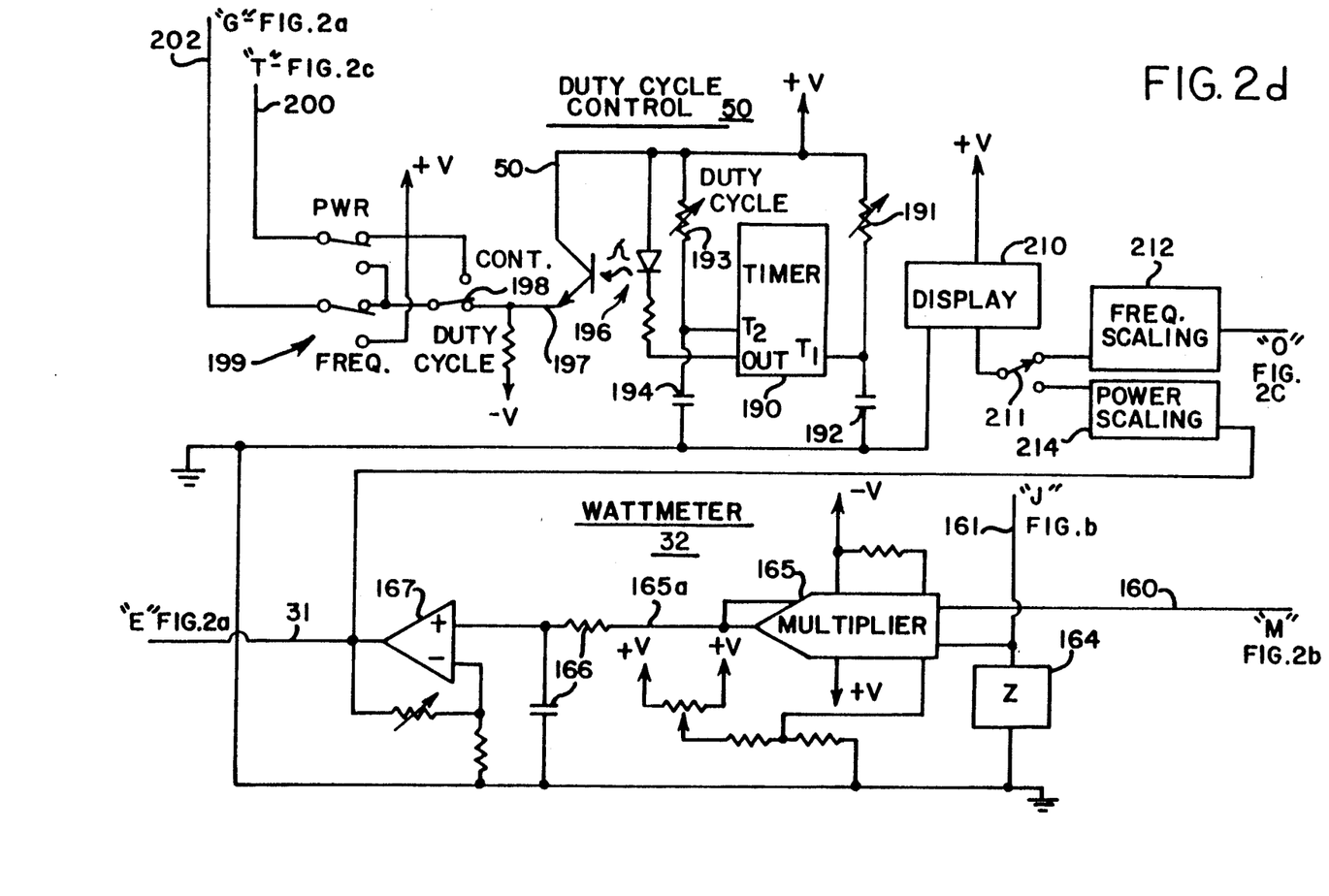

The voltage controlled oscillator 26 is based on a commercially available voltage control oscillator integrated circuit 140 having the standard biasing and frequency components, not all of which are illustrated in the drawings. However, the drawings do illustrate a capacitor 141 and a resistor 142 which represent the basic frequency determining elements of the voltage controlled oscillator 140. Those elements are selected such that the center frequency of the voltage controlled oscillator is set at about 40 kHz. A control voltage input 144 is provided on the voltage controlled oscillator 140 and has two signals supplying voltage thereto, those signals to tune the voltage controlled oscillator about the frequency established by the components 141, 142. A first signal is provided by way of weighting resistor 145 from the output of the resonance follower 30. Thus, the resonance follower 30 produces a DC signal having a level which is applied by way of weighting resistor 145 to the control input of voltage controlled oscillator 140 to tune the frequency within the range set by the frequency determining components 141, 142. Similarly, a second weighting resistor 146 provides a second control signal to the voltage controlled oscillator 140, derived from the frequency modulator 38. The frequency modulator 38 has the capability to couple a DC sine wave to the control input of the voltage controlled oscillator for the purpose of frequency modulating the output thereof, within a limited range and about the frequency established by the tuning components 141, 142. The output of the voltage controlled oscillator 140, taken on an output line 148, is AC coupled to the input of an operational amplifier 150 serving as an input of the predriver circuit 27. The function of the amplifier 150 is to present a high impedance to the voltage controlled oscillator 140 to prevent loading thereof. The output of the amplifier 150 is, in turn, coupled to the input of a second operational amplifier 151, having an output which drives the base of transistor 130 in the predriver circuit 27.

In accordance with an important aspect of the invention, the system monitors the actual power delivered to the load 22, produces a signal indicative of the level thereof, compares that signal to a desired power output signal, and controls the power delivered to the load such that the actual power delivered matches the demanded power level. For purposes of monitoring the actual power delivered to the load, a wattmeter circuit 32 is provided having two sets of inputs, a first set 160 adapted to monitor voltage across the load, and a second set 161 adapted to monitor load current. It is seen that both of the inputs 160, 161 are isolatingly coupled to the output circuit 29, by means such as transformers 162, 163. By transformer coupling the wattmeter and providing appropriate compensating circuitry in the wattmeter, the system is able to dispense with an input power isolation transformer, and as a result capture a substantial increase in operating efficiency.

Coupling transformer 162 has a primary 162a shunted across the load 22 and a secondary 162b coupled by means of input leads 160 to an input of an analog multiplier 165 which forms the input element of the wattmeter. The transformer 163 similarly has a primary coil 163a coupled in series with the load 22 so that all of the load current passes through the primary 2c 63a. The secondary 163b is coupled to the input leads 162c and thence to the multiplier 163. An impedance network illustrated schematically at 164 is coupled in the input circuit of the wattmeter to assure the appropriate phase and magnitude of the voltages and currents taken from the output circuit, to assure that the output of the multiplier 163, taken on a line 165a, is a true measure of power in the output circuit. Additional biasing elements and the like are associated with the multiplier 165, but will not be described in greater detail, since their use will be familiar to those skilled in the art. Of note, however, is an RC network 166 coupled to the output of the multiplier 165 to provide the multiplier with a sufficiently slow response characteristic to match the wattmeter circuit to the frequency response characteristics expected of the ultrasonic generator.

The multiplier output signal 165a, passed through the filter network 166, is provided as an input to an operational amplifier 167, having an output 31 which is coupled to the inverting input of amplifier 170 which serves as the input element of error amplifier 42. A reference signal is supplied by a control potentiometer 171, the wiper of which is connected to the non-inverting input of the amplifier 170. The potentiometer 171 is adapted to allow the user to select a predetermined power level. The power level selected provides a reference signal to the amplifier 170 which is then matched against the actual power level signal taken from the wattmeter on the line 31. The output of amplifier 170 is then fed to the inverting input of a further operational amplifier 172 whose output in turn is the line 44 which drives the preamplifier circuit 45 as described above. Thus, when the power level signal on line 31 is more positive than the desired power reference signal supplied by the control potentiometer 171, indicating that the output power level is higher than demanded, the output of amplifier 170 will be driven negatively, and that signal causes an increase in the signal level at the output of amplifier 172. As described above, that positive going signal reduces the phase angle of the triac 114, causing shorter conduction time of the triac for each cycle, and reducing the DC power on output bus 108, 110. As a result, less power is coupled to the load, the wattmeter multiplier 165 will sense the lower power levels by means of the voltage and current pickups 162, 163, the signal level on line 31 will be reduced, until an output level is achieved on the line 44 which has the actual and desired signals coupled to the input of amplifier in a balanced condition. An RC network 174 provides negative feedback around the amplifier 170, 172 combination with a time constant which causes the error amplifier 42 to modulate the conduction angle of triac 114 and thereby the output power level, but at a rate which will ignore very short term or cycle-to-cycle power differences which might be occasioned during automatic tuning of the VCO, or as a result of frequency modulation of the VCO signal. However, the time constant is such that if the user changes the desired power setting, the reaction of the circuit is rapid in readjusting to the newly set power level. Similarly, if conditions in the load are changed, such as by adding or removing material from the tank, the alteration in power delivered to the load resulting from an alteration in the load will be rapidly sensed by the wattmeter, and corrective action taken without wide or detrimental power swings in the load occasioned by such external factors.

In combination with the automatic constant power maintenance system just described, the invention provides a frequency follower operation which automatically tunes the voltage controlled oscillator 26 to the resonant frequency of the load 22. The frequency follower 30 includes an operational amplifier 175 having an input coupled to the output circuit 29 for the purpose of sensing conditions in the load to determine if the load is being driven at or near resonance. In the illustrated embodiment, the amplifier 175 is connected to sense the voltage across the load, being coupled to the secondary 162b of the transformer 162 which also serves as the voltage input for the wattmeter 32. The non-inverting input of amplifier 175 is coupled to the secondary 162b of transformer 162 and thus the output of that amplifier will replicate the frequency and magnitude of the voltage appearing across the load 22. As the system approaches resonance, the load voltage excursions peak, and the magnitude of that output signal is detected by the amplifier 175. A diode 176 connected to the amplifier output is provided for producing a peak signal at the output on the line 34 which is coupled by way of weighting resistor 145 to the control input 144 of the voltage controlled oscillator 140. Thus, the amplifier 175 produces a signal on line 34 having a level related to power in the load. If the control voltage on line 34 increases, which is a sign of increasing power in the load, the voltage controlled oscillator reduces its output frequency. That control action continues until resonance is reached, in which case the voltage across the load will begin to decrease. The decrease in the load voltage will serve to reduce the level of the control voltage on line 34, and that will cause the voltage controlled oscillator to increase its frequency. Thus, the output level on line 34 will tend to stabilize at a level which peaks the signal on line 34, which is the condition in existence at the time voltage in the load is at a maximum, which is the resonant condition.

In order to render the frequency follower 30 less sensitive to changes in operating power level set by the power level control 171, a power calibration circuit 179 is provided. It is seen that the power calibration circuit 179 has an input 180 which is coupled to the wattmeter output line 31, at the output of amplifier 167. A calibrating potentiometer 181 allows a proportion of that signal to be picked off and coupled to the inverting input of amplifier 175. Thus, when the power output in the load is at a relatively high level, the signal on line 31 is at a relatively high level, which couples a relatively high signal as a reference to the inverting input of amplifier 175. That requires a relatively high peak signal taken from the load to the non-inverting input of amplifier 175 to produce a voltage level on line 34 which automatically tunes the voltage controlled oscillator. By way of contrast, when the power level setting 171 is at a low level, the wattmeter circuit 32 produces a signal of relatively lower magnitude on the line 31, and that produces a less positive reference signal on the inverting input of amplifier 175. As a result, lower peaks in the output will cause the balance condition on line 34, and thus will achieve about the same resonant frequency of the voltage controlled oscillator, irrespective of whether the system is operating at full power or a lesser level. In a practical implementation of the invention, it may be desirable to forego tracking of resonant frequency and constant power down to the lowest power levels which the generator can produce. It is most important to maintain constant power and resonance tracking at high power levels, where efficiency is important, and the present invention preferably maintain those levels over a substantial range, such as from 200 to 500 watts for a 500 watt generator. However, it is also desirable to produce lesser power levels, and tradeoffs can be made in frequency tracking or constant power at lower power levels since efficiency in the circuit is less important at those levels.

It has been described in connection with FIG. 1 that the frequency follower 30 will not track or cancel frequency modulation intentionally introduced into the system. For that purpose, a filter network comprising shunt resistor 177 and capacitor 178 are connected to the output line 34. The time constant of those elements is such that the frequency can be modulated, even at relatively low rates, without the frequency follower 30 canceling the modulation by re-tuning of the voltage controlled oscillator. It is recalled that both the frequency follower 30 and the frequency modulator 38 provide control signals to the same control input of the voltage controlled oscillator. It is the purpose of resistor 177 and capacitor 178 to prevent the frequency follower 30 from substantially affecting that control voltage at rates which are as low as the modulation frequencies, which in some cases can be as low as 1 Hz. to 5 Hz.

The capacitor 178 is also useful when commencing a tuning operation, such as at system power-up. The capacitor will be discharged, thus providing a relatively low control voltage to the voltage controlled oscillator, causing the oscillator to begin a sweep at its highest available frequency. In a practical embodiment of the invention, the voltage controlled oscillator has an output frequency which can be varied within the range between 37 kHz. and 42.5 kHz. With the capacitor 178 discharged, the frequency sweep begins at the upper 42.5 kHz. limit and sweeps down toward resonance as the capacitor 178 is charged by the frequency follower amplifier 175.

For sweeping the automatically tuned frequency, the frequency modulator 38 includes a voltage controlled oscillator 180 having a selectable series of frequency setting capacitors 181 and a frequency setting resistor 182. The capacitors 181 are provided as a form of coarse frequency control to establish three ranges, 1–5 Hz., 5–50 Hz., and 50–500 Hz. The potentiometer 182 connected in the resistive branch of the frequency determining components of the voltage controlled oscillator allows the modulating frequency to be fine-tuned within those coarsely selected ranges. The modulating output of the voltage controlled oscillator 180 is taken on a line 185 and AC coupled to an input of operational amplifier 186. The input of amplifier 186 can thereby be considered a sine wave at the modulating frequency. The output of the amplifier 186 is coupled through a bandwidth establishing network 187 to the inverting input of an amplifier 188. The potentiometers in the bandwidth establishing circuit 187 establish the gain of the amplifier 188 and thereby the depth of the modulation. Thus, for frequency modulation, a switch allows the selection of capacitors 181 as a coarse frequency control, and the potentiometer 183 allows fine frequency control. Similarly, a potentiometer 188 in the network 187 allows adjustment of bandwidth so that both the frequency and depth of modulation are controlled at the output of the amplifier 188 taken On the line 39. It is seen that the line 39 is coupled back through weighting resistor 146 to the control input of the ultrasonic voltage controlled oscillator 140.

As a subsidiary feature of the invention, the system has the capability to duty cycle control either the power output or the frequency modulation of the ultrasonic output. To that end, a duty cycle control 50 is provided which is based on a dual timer 190. The timer 190 has a first set of frequency establishing components 191, 192 which serve to establish the period of the control, in a preferred example a one second period. A second set of frequency determining components including potentiometer 193 and capacitor 194 are provided to establish the relative on and off times during the fixed one second interval. Thus, the duty cycle can be controlled from zero percent, during which the output of the timer is always off, continuously to 100% during which the output is always on. The output is taken on a line 195 and coupled to an optoisolator 196. The output of the optoisolator is provided on a line 197 which is passed to a set of mechanical selector switches 198, 199. In the illustrated condition, the output of the optoisolator is coupled through the switch 198 so that the duty cycle established by the timer 190 appears at the output of the switch 198. When the switch 198 is in the alternate condition, the output of the switch 198 is maintained at a continuous positive control voltage, which is equivalent to 100% duty cycle, or continuous mode operation. The output of the switch 198 is coupled to a pair of inputs of the switch 199 which selects either frequency duty cycle operation or power duty cycle operation. The switch 199 is illustrated in the power duty cycle mode, in which case a positive control voltage coupled to a line 200 which serves as an enabling signal for the amplifier 186. Thus, the input amplifier 186 in the frequency modulation circuit will be always on, and frequency modulation, if selected, will be continuous. In the illustrated condition of switch 199, however, the duty cycle output on line 197 is coupled through a second bank of the switch 199 to a line 202 which serves as the input to the potentiometer 171 which selects the power level. Thus, the potentiometer 171, in the illustrated condition of switch 198, will be fed with alternate levels of control voltage and zero voltage for one second intervals at the duty cycle selected for the timer 190. Accordingly, the power level sensing amplifier 170 will alternately compare the actual power to a desired level selected by the potentiometer 171 and to a zero level. During the on periods of the duty cycle, the error amplifier 42 will cause phase modulation of the triac 114 to provide a voltage on the DC bus 108, 110 which corresponds to the desired power level setting of potentiometer 171, as measured by the wattmeter 32. During the off periods of the duty cycle, the amplifier 170 will balance the system to provide zero power output, thus maintaining the triac 114 off for the off-interval of the one second duty cycle interval. Thus, the error amplifier signal 42 will alternately switch between levels associated with the desired output and zero power output, causing the triac 114 to alternately operate between the phase angle associated with the desired power level and a zero phase angle associated with zero power.

When it is desired to duty cycle control the frequency modulation, the switch 199 is thrown to its alternate condition in which case a positive reference supply is coupled through the lower bank of the switch to the line 202, which maintain the positive reference on the power level control 171 at all times. Thus, the triac 114 will be continuously phase angle controlled to supply the desired power level on a continuous basis. However, the duty cycle signal from line 197 is thereby switched to the line 200 which serves as an enabling input for the amplifier 186. Thus, the amplifier will be enabled during the on period of the duty cycle and will provide a frequency modulating control signal to the voltage controlled oscillator 140 during those on intervals. However, during the off intervals of the duty cycle period, the amplifier 186 will be disabled, removing the frequency modulating signal 39 from the control input of the voltage controlled oscillator 140, thereby causing the voltage controlled oscillator 140 to operate at the resonant frequency selected by the frequency follower 30. The system will alternate between frequency modulation and no frequency modulation intervals for the selected portions of the one second period as established by the duty cycle control.

For operator convenience, the system provides a digital readout or display 210 which has an input supplied thereto by way of a switch 211. In the illustrated condition of the switch, the input to the display is provided by a frequency scaling element 212 which in turn is driven by the same signal as is applied to the control input of the voltage controlled oscillator 140. Thus, the frequency scaling circuit 212 operates on the control voltage to produce a display of the actual operating frequency of the ultrasonic generator. When the switch 211 is in the alternate condition, the input signal for the display is provided via a power scaling circuit 214 which in turn receives its input from the wattmeter output line 31. In that condition, the display 210 will provide an indication of the actual output power being coupled to the load 22.

It is noted in passing that a low voltage DC supply 220 is coupled to the output of the RFI filter 103. The low voltage supply 220 includes a standard isolation transformer to supply the lower level voltages needed for rectification and regulation to drive the remaining electronics. However, since the electronics are primarily integrated circuits operating at relatively low power levels, the transformer losses can be expected to be very low. It is important to recognize that the major proportion of the power which is passed through the system encounters no isolation transformer, thereby substantially increasing system efficiency and reducing heat buildup.

It will now be appreciated that what has been provided is an improved ultrasonic generator. The system provides substantial ease of operator use in that the operator is not involved in setting the frequency of the ultrasonic generator. Indeed, the ultrasonic generator tunes itself to the resonant frequency of the load which is a very important factor in maximizing efficiency and power output, particularly at high output levels. The focus of the user is in setting the power to be delivered to the load, and that is accomplished by setting a single control and, if desired, watching the display. The user sets the power level control to produce a signal having a level related to the desired operating power, and a wattmeter coupled in the output circuit measures the actual power delivered to the load and provides a signal indicative thereof. A power modulating circuit compares those two signals and modulates the DC supply to the power amplifier as a means of controlling power in the load. Thus, even though the frequency of the ultrasonic generator is being tuned by the automatic resonance follower, an independent means modulates another mechanism, in this case the DC delivered to the power amplifier, in order to control the power in the load. As a result, the user is provided with simplicity of operation while being assured that even at high power levels, the efficiency of the system is such as to deliver the desired power to the load.

Further features included in the system are a frequency modulating input which cooperates with both the automatic resonance tuning and the constant power output elements to allow frequency modulation of the ultrasonic output while maintaining the desired level of constant power to the load.

What is claimed is:

1. A generator for driving an ultrasonic transducer comprising, in combination:
   an output circuit including the ultrasonic transducer and a coupled load, the output circuit having a resonant frequency which is affected by the magnitude of the load presented to the ultrasonic transducer,
   a voltage controlled oscillator for driving the output circuit, the voltage controlled oscillator having a frequency variable within a predetermined limited range,
   a resonance follower having an input connected to the output circuit and being coupled to the voltage controlled oscillator for tuning the voltage controlled oscillator to the resonant frequency of the output circuit, the resonance follower including means for sweeping the voltage controlled oscillator through at least a part of the operating frequency range thereof until the resonance follower determines that the output circuit is oscillating at about the resonance frequency of the load,
   a power control circuit including a user settable power level control for setting a power demand signal, a wattmeter connected in the output circuit for producing a signal relating to the actual power delivered by the output circuit, and means for modulating the DC power supplied to the output circuit to cause the actual power to be at a level established by the demanded power, the output power setting means being effective across at least a part of the range of the voltage controlled oscillator for matching the delivered power to the demanded power over the range of frequencies at which the load can resonate.

2. The combination as set forth in claim 1 further including modulating means for establishing a frequency modulating signal and applying said frequency modulating signal to the voltage controlled oscillator, thereby to modulate the frequency of the output circuit about the resonant frequency.

3. The combination as set forth in claim 2 further including user adjustable means for establishing the characteristics of the frequency modulating signal including the modulating frequency and the modulating depth.

4. The combination as set forth in claim 1 further including duty cycle control means for alternating the output stage between an on condition in which ultrasonic power is generated at the level established by the power setting control, and an off condition in which the output stage delivers substantially no power to the load.

5. The combination as set forth in claim 2 further including duty cycle control means for alternating the output stage between an on condition in which ultrasonic power is generated at the level established by the power setting control, and an off condition in which the output stage delivers substantially no power to the load.

6. The combination as set forth in claim 2 further including duty cycle control means for cooperating with the modulating means for alternating the frequency of the output circuit between an on condition in which frequency modulation is applied to the resonant frequency and an off condition in which no frequency modulation is applied.

7. The combination as set forth in claim 2 wherein the resonance follower is provided with a time constant which prevents the resonance follower from tuning the voltage controlled oscillator to cancel modulation introduced by the modulating means.

8. The combination as set forth in claim 1 wherein the power control circuit includes a thyristor connected to modulate the voltage level of the DC power supplied to the output circuit, and means responsive to the power demand signal and the actual power signal for modulating the phase of the triac thereby to match the actual power level to the demanded level.

9. The combination as set forth in claim 8 in which the wattmeter include an analog multiplier having a voltage input and a current input, the respective inputs being transformer coupled in the output circuit for providing isolated signals related to the voltage and current levels in the output circuit.

10. A generator for driving an ultrasonic transducer comprising, in combination:
    an output stage connected to the transducer and forming an output circuit therewith,
    a controlled oscillator coupled to the output stage for establishing the operating frequency thereof,
    a variable DC supply connected to the output stage for supplying power thereto, first control means coupled to the controlled oscillator for automatically seeking the resonant frequency of the output circuit, second control means coupled to the variable DC supply for adjusting the output power to a desired level, the second control means including a power setting control for setting the desired power level, a wattmeter connected to the output circuit for measuring the actual output power, and means responsive to the power setting control and the wattmeter for adjusting the variable DC supply to match the actual power to the desired power, frequency modulation means coupled to the controlled oscillator for modulating the operating frequency about the resonant frequency, the respective control means being sufficiently independent to allow the user to independently adjust power level and frequency modulation at the automatically tuned resonant frequency.

11. A generator for driving an ultrasonic transducer comprising, in combination:

an output circuit including an output stage for driving a load including the ultrasonic transducer, a wattmeter connected in the output circuit for determining the actual output power delivered to the load, a voltage controlled oscillator having an output frequency variable over a predetermined limited range and connected to the output stage for establishing the output frequency at which the load is driven, means for establishing a control voltage for the voltage controlled oscillator and comprising:

a resonance follower having an input coupled to the driver circuit for sensing conditions in the load and adapted to produce an output signal which tunes the voltage controlled oscillator to the resonant frequency of the load, frequency modulation means having a user settable control for establishing a modulating frequency, and being coupled to the control circuit for causing the voltage controlled oscillator to produce an output frequency which is modulated about the automatically tuned resonant frequency, and a second control loop including a user adjustable power setting and means responsive to the power setting and the wattmeter for modulating the level of the voltage supply for the output stage to cause the power delivered to the load to be at the user adjusted level as the frequency of the ultrasonic load is modulated about the automatically tuned resonance frequency.

12. The combination as set forth in claim 11 further including a duty cycle control for switching the characteristics of the output signal driving the ultrasonic transducer.

13. The combination as set forth in claim 12 in which the duty cycle control is coupled to the amplitude modulated power circuit for switching the output stage on and off at a rate selected by the duty cycle control.

14. The combination as set forth in claim 12 in which the duty cycle control includes means coupled to the frequency modulation means for switching the frequency modulation on and off at a rate determined by the duty cycle control.

15. The combination as set forth in claim 11 wherein the resonance follower is coupled to the wattmeter for detecting the load current or voltage in the load as a measure of the operating characteristics of the output circuit.

16. The combination as set forth in claim 11 in which the second control loop includes a thyristor connected to modulate the voltage supply for the output stage, and an error amplifier connected to compare a signal relating to the user adjustable power setting and a signal relating to the power delivered to the load, and having an output for phase modulating the thyristor to produce an output voltage level which establishes the actual power level at the demanded level.

17. The combination as set forth in claim 11 in which the voltage controlled oscillator has an operating frequency range, and the resonance follower includes means for sweeping the output frequency of the voltage controlled oscillator from one end of the range toward the other until the resonant frequency is attained.

18. A generator for driving an ultrasonic transducer coupled to a cleaning tank, the tank being adapted to hold a volume of cleaning liquid for ultrasonic cleaning of parts immersed in the liquid, the generator comprising, in combination:

an output circuit including the ultrasonic transducer and a coupled load, the output circuit having a resonant frequency which is affected by the magnitude of the load presented to the ultrasonic transducer, a voltage controlled oscillator for driving the output circuit, the voltage controlled oscillator having a frequency variable within a predetermined range, a resonance follower coupled to the voltage controlled oscillator for tuning the voltage controlled oscillator to the resonant frequency of the output circuit, a power control circuit including a user settable power level control for setting a power demand signal, means for determining the actual power delivered to the output circuit, and means for matching the actual power to the demanded power, and means for operating the generator in a degas mode, such means including means for frequency modulating the output frequency of the voltage controlled oscillator at a rate and to a depth capable of eliminating bubbles from the liquid in the ultrasonic cleaning tank.

19. A method for driving an ultrasonic transducer coupled to a load including a cleaning tank, the tank being adapted to hold a volume of cleaning liquid for ultrasonic cleaning of parts immersed in the liquid, the method being adapted to de-gas the liquid in the tank by eliminating bubbles from said liquid, the method comprising the steps of:

driving the transducer at a frequency determined by a controlled oscillator, tuning the controlled oscillator to a resonant frequency of the transducer and coupled load, controlling the power delivered to the transducer to a level determined by a power setting control so as to operate the transducer at the set power level, and frequency modulating the output frequency of the oscillator about the automatically tuned frequency at a rate and to a depth capable of eliminating bubbles from the liquid in the ultrasonic cleaning tank, thereby to de-gas the liquid.

* * * * *